United States Patent [19]

Lee

[11] Patent Number: 5,668,020
[45] Date of Patent: Sep. 16, 1997

[54] METHOD FOR FORMING IMPURITY JUNCTION REGIONS OF SEMICONDUCTOR DEVICE

[75] Inventor: Kil Ho Lee, Kyoungki-do, Rep. of Korea

[73] Assignee: Hyundai Electronics Industries Co., Ltd., Kyoungki-do, Rep. of Korea

[21] Appl. No.: 651,856

[22] Filed: May 21, 1996

[30] Foreign Application Priority Data

May 22, 1995 [KR] Rep. of Korea .................. 95-12740

[51] Int. Cl.$^6$ .................................... H01L 21/266
[52] U.S. Cl. .................. 437/303; 148/DIG. 61; 438/305
[58] Field of Search ............... 437/11, 24, 44, 437/984; 148/DIG. 1, DIG. 61, DIG. 106, DIG. 157

[56] References Cited

U.S. PATENT DOCUMENTS

| | | | |
|---|---|---|---|
| 4,597,827 | 7/1986 | Nishitani et al. | 437/44 |
| 5,223,445 | 6/1993 | Fuse | 437/24 |
| 5,416,033 | 5/1995 | Lee et al. | 437/44 |

Primary Examiner—Chandra Chaudhari
Attorney, Agent, or Firm—Reid & Priest LLP

[57] ABSTRACT

A method for forming impurity junction regions of a semiconductor device wherein impurity junction regions with a small depth are formed by selectively forming defecting regions and amorphous regions in a semiconductor substrate by an implantation of impurity ions with a large molecular weight, thereby achieving an improvement in the characteristics of the semiconductor device. The method includes the steps of forming a first photoresist film pattern on an active region portion of a semiconductor substrate, implanting first impurity ions in exposed portions of said semiconductor substrate using said first photoresist film pattern as a mask, thereby forming defecting regions, removing said first photoresist film pattern, forming a second photoresist film pattern on the exposed semiconductor surface portions except for the portion which was covered with said first photoresist film pattern, implanting second impurity ions in exposed portions of said semiconductor substrate using said second photoresist film pattern as a mask, thereby forming amorphous regions, removing said second photoresist film pattern, and implanting third impurity ions in said active region portion of said semiconductor substrate, thereby forming impurity junction regions.

20 Claims, 2 Drawing Sheets

METHOD FOR FORMING IMPURITY JUNCTION REGIONS OF SEMICONDUCTOR DEVICE

BACKGROUND OF THE INVENTION

1. Field of the Invention

The present invention relates to a method for fabricating semiconductor devices, and more particularly to a method for forming impurity junction regions of a semiconductor device, capable of forming impurity junction regions with a small depth by selectively forming defecting regions and amorphous regions in a semiconductor substrate, thereby achieving an improvement in the characteristics of the semiconductor device.

2. Description of the Prior Art

Where $N^+P$ junctions are formed in impurity junction regions of a semiconductor device, it is possible to reduce the depth of the junctions because the $N^+P$ junctions have a large mass, a small ion implantation width and a low diffusion coefficient. In order to form such $N^+P$ junctions, $BF_2$ ions are typically implanted in a semiconductor substrate. In this case, however, it is difficult to form thin junctions because of a severe channeling phenomenon caused by boron ions and a high diffusion coefficient of boron.

Furthermore, a straggling phenomenon that implanted ions are laterally straggled occurs at the ion implanting step. Due to such a straggling phenomenon, boron ions penetrate portions of the semiconductor substrate disposed beneath end portions of the gate oxide film and insulating film spacers formed on the side walls of the gate electrode.

Since the boron ions penetrating the semiconductor substrate portions beneath the insulating film spacers have a high diffusion coefficient, they are laterally diffused, thereby reducing the effective electrode length, namely, the channel length.

Due to the reduced channel length of the semiconductor device, a short channel effect occurs. That is, the current between the source and drain increases continuously without being saturated even when the drain voltage passes its pinch-off point and reaches its saturated point. Also, a punch-through phenomenon occurs.

Fluorine ions contained in $BF_2$ implanted in the semiconductor substrate as impurity ions for impurity junction regions serve to form a thin amorphous layer. Along with primary defects formed at the ion implanting step, the thin amorphous layer serves to form an extended defect in the surface portion of the semiconductor substrate at a subsequent annealing step. As a result, an increase in contact resistance occurs at a step of forming contacts.

Such undesirable phenomenons result in a degradation in the characteristics of the semiconductor device such as an increase in the amount of junction leakage current. Consequently, there are problems such as a degradation in reliability and difficulty in integration.

Conventional methods involving the above-mentioned problems will be described in detail, in conjunction with FIGS. 1 and 2.

FIG. 1 is a sectional view of a semiconductor device, explaining a conventional method for forming impurity junction regions.

In accordance with this method, a semiconductor substrate 1 is first prepared, which is provided with an N well 2, as shown in FIG. 1. The N well 2 is formed in the surface portion of the semiconductor substrate 1. An element-isolating oxide film 3 is then formed on a desired portion of the semiconductor substrate 1 using a LOCOS process. The element-isolating oxide film 3 serves to define active and field regions of the semiconductor substrate 1. Thereafter, a gate oxide film 4 is formed on a portion of the semiconductor substrate 1 corresponding to the active region. On the gate oxide film 4, a gate electrode 5 is formed.

Subsequently, insulating film spacers 6 are formed on opposite side walls of the gate oxide film 4 and gate electrode 5, respectively.

Using the upper surface of the gate electrode 5, the insulating film spacers 6 and the element-isolating oxide film 3 as a mask, $BF_2$ impurity ions are implanted in the active region of the semiconductor substrate 1, thereby forming impurity junction regions 7.

In accordance with the above-mentioned conventional method, however, an extended defect 8 with a width of "a" is formed in each impurity junction region 7 at the surface portion of the semiconductor substrate 1, as shown in FIG. 1. This will be described in more detail.

Since this method uses $BF_2$ as impurity ions for impurity junction regions, it involves a short channel effect and a punch-through phenomenon. This is because $BF_2$ impurity ions are laterally straggled due to a high diffusion coefficient of boron (B) contained in $BF_2$.

As a result, a thin amorphous layer is formed at each impurity junction region by fluorine (F) contained in $BF_2$. Along with the primary defect occurring at the ion implanting step, the thin amorphous layer serves to form an extended defect in the surface portion of the semiconductor substrate where the N well is disposed, namely, the substrate surface portion disposed beneath the insulating spacers and element-isolating oxide film, at a subsequent annealing step.

Referring to FIG. 2, another conventional method for forming impurity junction regions is illustrated. FIG. 2 is a sectional view of a semiconductor device formed with impurity junction regions in accordance with this method.

In accordance with the conventional method, a semiconductor substrate 1 is first prepared, which is provided with an N well 12, as shown in FIG. 2. The N well 12 is formed in the surface portion of the semiconductor substrate 11. An element-isolating oxide film 13 is then formed on a desired portion of the semiconductor substrate 11 using a LOCOS process. The element-isolating oxide film 13 serves to define active and field regions of the semiconductor substrate 11. Thereafter, a gate oxide film 14 is formed on a portion of the semiconductor substrate 11 corresponding to the active region. On the gate oxide film 14, a gate electrode 15 is formed.

Subsequently, insulating film spacers 16 are formed on opposite side walls of the gate oxide film 14 and gate electrode 15, respectively.

Using the upper exposed surface of the gate electrode 15, the insulating film spacers 16 and the element-isolating oxide film 13 as a mask, impurity ions with a large molecular weight are implanted in the active region of the semiconductor substrate 11, thereby forming amorphous layers 17 respectively in desired surface portions of the semiconductor substrate 11.

$BF_2$ impurity ions are then implanted in the active region of the semiconductor substrate 11, thereby forming impurity junction regions 18 beneath the amorphous layers 17. Each impurity junction region 18 has a small thickness by virtue of a suppressed channelling by boron ions.

In accordance with the above-mentioned conventional method, however, an extended defect 19 with a width of "b" is formed beneath the interface between each amorphous layer 17 and each corresponding impurity junction region 18 at a subsequent annealing step because the amorphous layer 17 is formed using impurity ions with a large molecular weight. Thus, the extended defect is widely distributed such that it extends to the end of the gate oxide film, thereby resulting in an increase in the amount of junction leakage current.

SUMMARY OF THE INVENTION

Therefore, an object of the invention is to solve the abovementioned problems involved in the conventional methods and to provide a method for forming impurity junction regions of a semiconductor device, capable of forming impurity junction regions with a small depth by selectively forming defecting regions and amorphous regions in a semiconductor substrate by an implantation of impurity ions with a large molecular weight, thereby achieving an improvement in the characteristics of the semiconductor device.

In accordance with one aspect, the present invention provides a method for forming junction impurity regions of a semiconductor device, comprising the steps of: preparing a semiconductor substrate; forming an element-isolating oxide film defining a field region and an active region in said semiconductor substrate; forming a first photoresist film pattern on a portion of said semiconductor substrate corresponding to said active region; implanting first impurity ions in active region portions of said semiconductor substrate exposed at both sides of said first photoresist film pattern under a condition that said first photoresist film pattern is used as a mask, thereby forming defecting regions; removing said first photoresist film pattern, and then forming a second photoresist film pattern on the exposed semiconductor surface portions except for the portion which was covered with said first photoresist film pattern; implanting second impurity ions in portions of said semiconductor substrate exposed after the formation of said second photoresist film pattern under a condition that said second photoresist film pattern is used as a mask, thereby forming amorphous regions; and removing said second photoresist film pattern, and then implanting third impurity ions in the portion of the semiconductor substrate corresponding to said active region, thereby forming impurity junction regions.

In accordance with another aspect, the present invention provides a method for forming junction impurity regions of a semiconductor device, comprising the steps of: preparing a semiconductor substrate; forming an element-isolating insulating film defining a field region and an active region in said semiconductor substrate, forming a gate oxide film on a portion of said semiconductor substrate corresponding to said active region, forming a gate electrode on said gate insulating film, and forming insulating film spacers respectively on side walls of said gate electrode and gate insulating film; forming a first photoresist film pattern on a portion of said semiconductor substrate corresponding to said active region; implanting first impurity ions in portions of said semiconductor substrate exposed after the formation of said first photoresist film pattern under a condition that said first photoresist film pattern is used as a mask, thereby forming defecting regions; removing said first photoresist film pattern, and then forming a second photoresist film pattern on the exposed semiconductor surface portions except for the portion which was covered with said first photoresist film pattern; implanting second impurity ions in portions of said semiconductor substrate exposed after the formation of said second photoresist film pattern under a condition that said second photoresist film pattern is used as a mask, thereby forming amorphous regions; and removing said second photoresist film pattern, and then implanting third impurity ions in a portion of said semiconductor substrate corresponding to said active region under a condition that said element-isolating insulating film, gate electrode and insulating film spacers are used as a mask, thereby forming impurity junction regions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 3A to 3D are sectional views respectively illustrating a method for forming impurity junction regions of a semiconductor device in accordance with the present invention.

Figure 1:
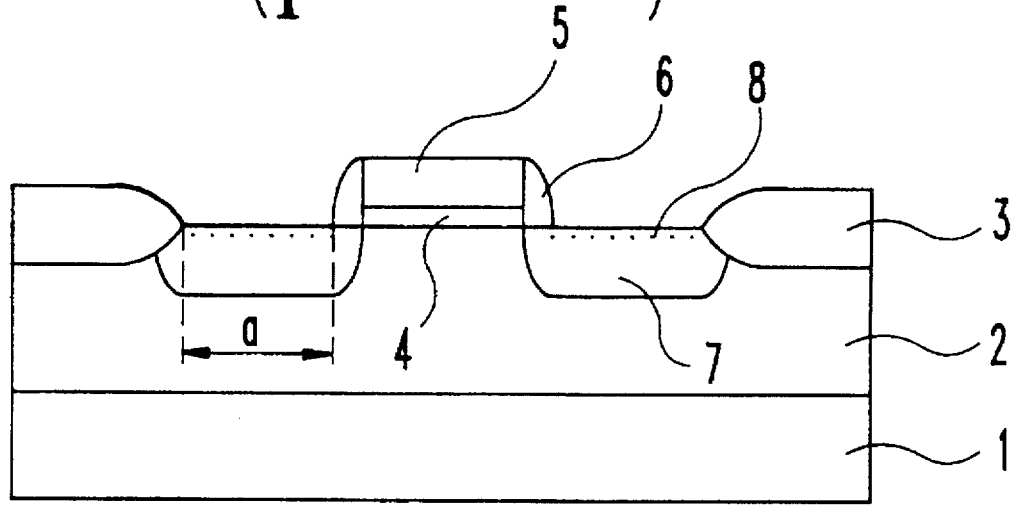
FIG. 1 is a sectional view of a semiconductor device, explaining a conventional method for forming impurity junction regions.
Figure 2:
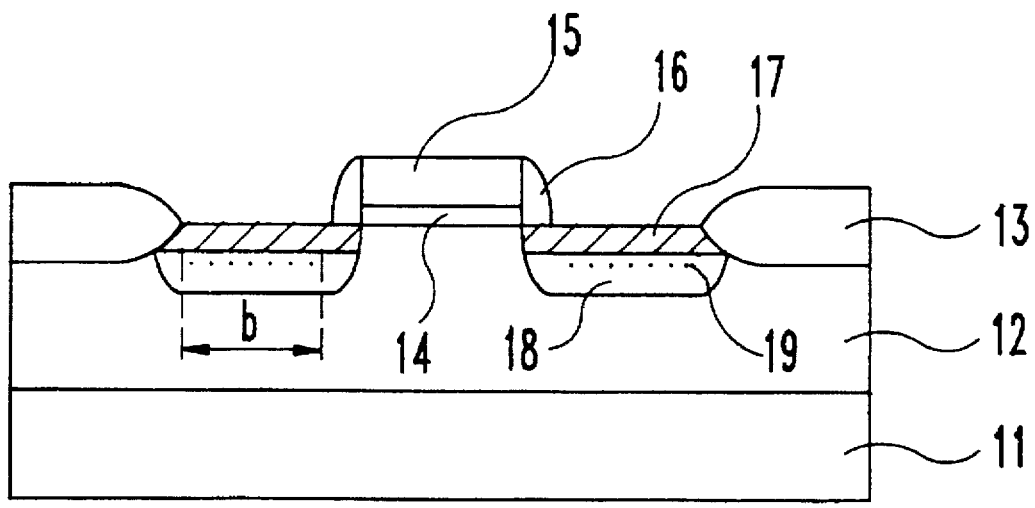
FIG. 2 is a sectional view of a semiconductor device, explaining another conventional method for forming impurity junction regions.
Figure 3A:
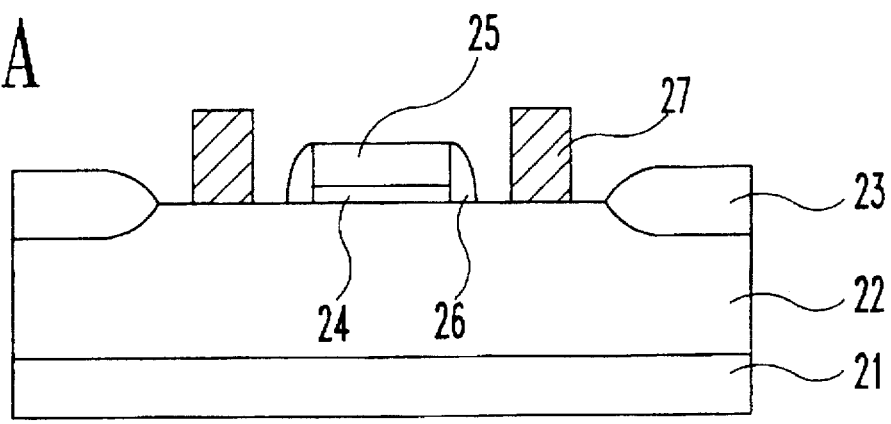
FIGS. 3A to 3D are sectional views respectively illustrating a method for forming impurity junction regions of a semiconductor device in accordance with the present invention.

In accordance with the method of the present invention, a semiconductor substrate 21 is first prepared, which is provided with an N well 22, as shown in FIG. 3A. The N well 22 is formed in the surface portion of the semiconductor substrate 21. An element-isolating oxide film 23 is then formed on a desired portion of the semiconductor substrate 21 using a LOCOS process. The element-isolating oxide film 23 serves to define active and field regions of the semiconductor substrate 21.

Thereafter, a gate oxide film 24 is formed on a portion of the semiconductor substrate 21 corresponding to the active region. On the gate oxide film 24, a gate electrode 25 is then formed.

Subsequently, insulating film spacers 26 are formed on opposite side walls of the gate oxide film 24 and gate electrode 25, respectively.

A first photoresist film pattern 27 is then formed on a desired portion of the semiconductor substrate 21 corresponding to an active region portion disposed between each insulating film spacer 26 and a portion of the element-isolating oxide film 23 facing the insulating film spacer 26. In this case, the active region portion is partially exposed at both sides of the first photoresist film pattern 27.

Figure 3B:
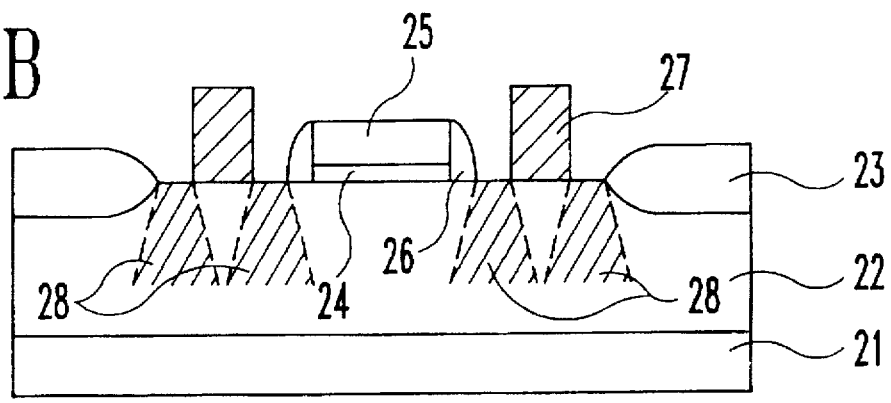

Using the element-isolating oxide film 23, gate electrode 25, insulating film spacers 26 and first photoresist film pattern 27 as a mask, impurity ions with a large molecular weight are implanted in the entire exposed portions of the resulting structure, thereby forming defecting regions 28, as shown in FIG. 3B.

As the heavy impurity ions, any one of germanium (Ge), silicon (Si), arsenic (As), antimony (Sd) or indium (In) is selected.

The formation of the defecting regions 28 is carried out by implanting the heavy impurity ions using energy corresponding to about 2 to 10 times the ion implantation energy used to form impurity junction regions in the semiconductor substrate 21.

In accordance with the present invention, the amount of implanted heavy impurity ions is preferably less than the critical amount capable of forming an amorphous layer at the semiconductor substrate 21. Accordingly, silicon atoms constituting the semiconductor substrate 21 can maintain their crystalline characteristic.

The critical implantation amount of the heavy impurity ions is about $9E13/cm^2$ in the case of germanium, about $5E14/cm^2$ in the case of silicon, and about $2E14/cm^2$ in the case of arsenic.

The critical implantation amount and ion implantation energy of the heavy impurity ions may be appropriately controlled in accordance with the junction depth of the impurity junction regions depending on the design rule determining the integration degree of semiconductor devices.

Meanwhile, each defecting region 28 extends to a portion of the semiconductor substrate 21 disposed beneath the first photoresist film pattern 27 due to its lateral straggling occurring at the impurity ion implanting step.

Since the ion implantation is carried out using high ion implantation energy, the implanted impurity ions strike against the silicon atoms of the semiconductor substrate 21, thereby causing the silicon atoms to migrate from their own places. As a result, a plurality of vacancies are formed. Such vacancies are a kind of defect occurring in the defecting regions 28.

Figure 3C:
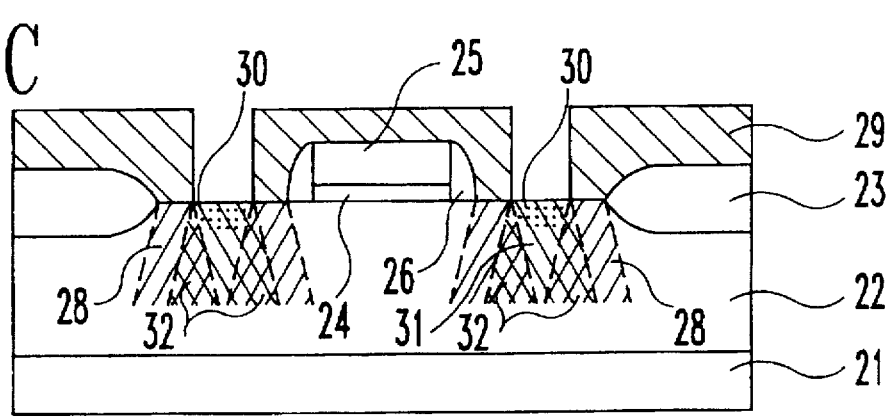

The first photoresist film pattern 27 is then completely removed, as shown in FIG. 3C. On exposed surface portions of the resulting structure except for the portion which was covered with the first photoresist film pattern 27, a second photoresist film pattern 29 is then formed.

In this case, the second photoresist film pattern 29 serves to expose only the active region portion of the semiconductor substrate 21 which was covered with the first photoresist film pattern 27.

Using the second photoresist film pattern 29 as a mask, the same impurity ions as those used in the defecting step are implanted in the resulting structure, thereby forming amorphous regions 30. Preferably, the formation of such amorphous regions is carried out using ion implantation energy corresponding to about 1.5 to 5 times that used upon forming impurity diffused regions in the N well 22 of the semiconductor substrate 21.

It is also preferred that the amount of implanted heavy impurity ions be more than the critical amount capable of forming an amorphous structure.

At the step of forming the amorphous structure, silicon atoms existing in the surface portion of the semiconductor substrate 21 migrate downwardly by virtue of the heavy impurity ions implanted for the formation of the amorphous structure, so that they may be interstitially interposed among silicon atoms existing in the under portion of the semiconductor substrate 21 disposed beneath the surface portion. Accordingly, interstitial regions 31 are formed beneath the amorphous regions 30, respectively.

Since a lateral straggling phenomenon occurs at the step of forming the amorphous structure, another interstitial region 31 is also formed in a portion of the semiconductor substrate 21 disposed beneath each end portion of the second photoresist film pattern 29.

As a result, each defecting region 28 overlaps with the interstitial regions 31, so that a plurality of vacancies formed in the interstitial regions 31 may coexist with the interstitial atoms in the interstitial regions 31, thereby forming vacancy/interstitial coexisting regions 32.

Figure 3D:
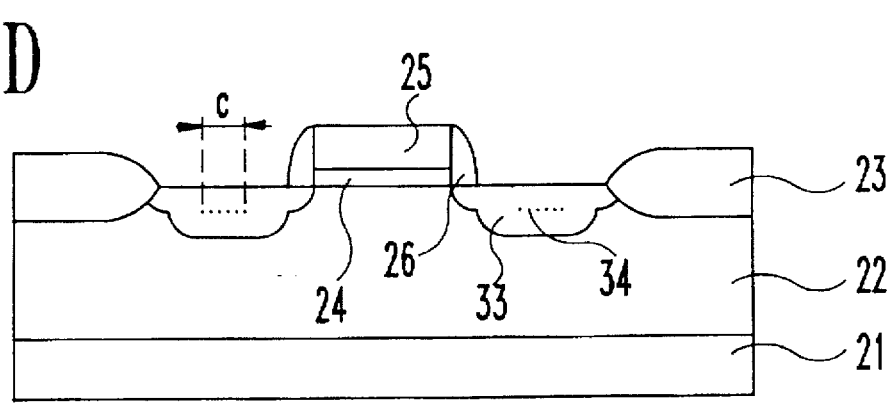

The second photoresist film pattern 29 is then removed, as shown in FIG. 3D. Using the gate electrode 25, insulating film spacers 26 and element-isolating oxide film 23 as a mask, $BF_2$ impurity ions are implanted in the active region of the semiconductor substrate 21, thereby forming impurity junction regions 33.

When a subsequent step involving an annealing is carried out, the vacancies and interstitial atoms coexisting in the vacancy/interstitial coexisting regions 32 are re-combined together. By virtue of such a re-coupling of the vacancies and interstitial atoms, defects formed in the coexisting regions 32 are completely removed. Only an extended defect region 34 with a width of "c" is formed in each interstitial region 31. The width "c" of the extended defect region 34 is smaller than the widths "a" and "b" of the defect regions formed in accordance with the conventional methods.

Meanwhile, boron ions contained in $BF_2$ are diffused in accordance with the interstitial mechanism. The diffusion rate of boron ions carried out in the defecting regions 28 is lower than that in the interstitial regions 31 formed beneath the amorphous regions 30 because the defecting regions 28 have deep vacancies.

As a result, the impurity junction regions 33 have a small junction depth while having extended defects 34 with a narrow width.

The interstitial regions are formed in the semiconductor substrate at a deeper position than the amorphous regions 30 because the ion implantation energy used to form the defecting regions 28 is higher than that used to form the amorphous regions 30. Accordingly, the interstitial regions cannot contribute to the diffusion of boron ions.

As apparent from the above description, the present invention provides a method for forming impurity junction regions of semiconductor devices, wherein the implantation of impurity ions in a semiconductor substrate to form impurity junction regions is carried out, following steps of forming defecting regions and amorphous regions in the semiconductor substrate. In accordance with this method, it is possible to form impurity junction regions with a small junction depth while reducing the width of extended defects. As a result, there is no short channel effect nor punch-through phenomenon. It is also possible to reduce the amount of junction leakage current, thereby improving the characteristics of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming junction impurity regions of a semiconductor device, comprising the steps of:

preparing a semiconductor substrate;

forming an element-isolating oxide film defining a field region and an active region in said semiconductor substrate;

forming a first photoresist film pattern on a portion of said semiconductor substrate corresponding to said active region;

implanting first impurity ions in active region portions of said semiconductor substrate exposed at both sides of said first photoresist film pattern under a condition that said first photoresist film pattern is used as a mask, thereby forming defecting regions;

removing said first photoresist film pattern, and then forming a second photoresist film pattern on the exposed semiconductor surface portions except for the portion which was covered with said first photoresist film pattern;

implanting second impurity ions in portions of said semiconductor substrate exposed after the formation of said second photoresist film pattern under a condition that said second photoresist film pattern is used as a mask, thereby forming amorphous regions; and removing said second photoresist film pattern, and then implanting third impurity ions in the portion of said semiconductor substrate corresponding to said active region, thereby forming impurity junction regions.

2. The method in accordance with claim 1, wherein said first impurity ions used to form the defecting regions are implanted in an amount less than a critical amount capable of forming an amorphous structure.

3. The method in accordance with claim 1, wherein said first impurity ions are identical to said second impurity ions.

4. The method in accordance with claim 1, wherein said first and second impurity ions consist of a fourth-Group element.

5. The method in accordance with claim 1, wherein said first and second impurity ions consist of arsenic.

6. The method in accordance with claim 1, wherein said first and second impurity ions consist of indium.

7. The method in accordance with claim 1, wherein the step of forming said defecting regions is carried out by using ion implantation energy corresponding to about 2 to 10 times that used to form said impurity junction regions.

8. The method in accordance with claim 1, wherein the step of forming said amorphous regions is carried out by using ion implantation energy corresponding to about 1.5 to 5 times that used to form said impurity junction regions.

9. The method in accordance with claim 1, wherein said third impurity ions consist of $BF_2$.

10. The method in accordance with claim 1, further comprising the step of sequentially forming a gate oxide film, a gate electrode and insulating film spacers on the portion of said semiconductor substrate corresponding to said active region after the formation of said element-isolating oxide film.

11. A method for forming junction impurity regions of a semiconductor device, comprising the steps of:

preparing a semiconductor substrate;

forming an element-isolating insulating film defining a field region and an active region in said semiconductor substrate, forming a gate oxide film on a portion of said semiconductor substrate corresponding to said active region, forming a gate electrode on said gate insulating film, and forming insulating film spacers respectively on side walls of said gate electrode and gate insulating film;

forming a first photoresist film pattern on the portion of said semiconductor substrate corresponding to said active region;

implanting first impurity ions in portions of said semiconductor substrate exposed after the formation of said first photoresist film pattern under a condition that said first photoresist film pattern is used as a mask, thereby forming defecting regions;

removing said first photoresist film pattern, and then forming a second photoresist film pattern on the exposed semiconductor surface portions except for the portion which was covered with said first photoresist film pattern;

implanting second impurity ions in portions of said semiconductor substrate exposed after the formation of said second photoresist film pattern under a condition that said second photoresist film pattern is used as a mask, thereby forming amorphous regions; and removing said second photoresist film pattern, and then implanting third impurity ions in the portion of said semiconductor substrate corresponding to said active region under a condition that said element-isolating insulating film, gate electrode and insulating film spacers are used as a mask, thereby forming impurity junction regions.

12. The method in accordance with claim 11, wherein said first photoresist film pattern serves to expose portions of the semiconductor substrate disposed between each insulating film spacer and a portion of said element-isolating insulating film facing said insulating film spacer.

13. The method in accordance with claim 11, wherein said first impurity ions used to form the defecting regions are implanted in an amount less than a critical amount capable of forming an amorphous structure.

14. The method in accordance with claim 11, wherein said first impurity ions are identical to said second impurity ions.

15. The method in accordance with claim 11, wherein said first and second impurity ions consist of a fourth-Group element.

16. The method in accordance with claim 11, wherein said first and second impurity ions consist of arsenic.

17. The method in accordance with claim 11, wherein said first and second impurity ions consist of indium.

18. The method in accordance with claim 11, wherein the step of forming said defecting regions is carried out by using ion implantation energy corresponding to about 2 to 10 times that used to form said impurity junction regions.

19. The method in accordance with claim 11, wherein the step of forming said amorphous regions is carried out by using ion implantation energy corresponding to about 1.5 to 5 times that used to form said impurity junction regions.

20. The method in accordance with claim 11, wherein said third impurity ions consist of $BF_2$.

* * * * *